United States Patent
Yoshida

(10) Patent No.: US 6,246,085 B1
(45) Date of Patent: *Jun. 12, 2001

(54) SEMICONDUCTOR DEVICE HAVING A THROUGH-HOLE OF A TWO-LEVEL STRUCTURE

(75) Inventor: Naoyuki Yoshida, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/019,707

(22) Filed: Feb. 6, 1998

(30) Foreign Application Priority Data

Feb. 19, 1997 (JP) .................................... 9-034919

(51) Int. Cl.[7] ............................. H01L 29/76; H01L 29/94
(52) U.S. Cl. ............................................. 257/301; 257/758
(58) Field of Search ............................. 257/758, 748, 257/508, 301, 303; 438/253, 396; 427/309

(56) References Cited

U.S. PATENT DOCUMENTS

| | | | |
|---|---|---|---|
| 5,451,539 | * 9/1995 | Ryou | 438/396 |
| 5,478,768 | * 12/1995 | Iwasa | 438/253 |
| 5,532,956 | * 7/1996 | Watanabe | 365/149 |
| 5,701,647 | * 12/1997 | Saenger et al. | 438/396 |
| 5,789,030 | * 8/1998 | Rolfson | 427/309 |
| 5,808,855 | * 9/1998 | Chan et al. | 361/321.4 |
| 5,825,059 | * 10/1998 | Kuroda | 257/301 |
| 6,005,268 | * 12/1999 | Parekh et al. | 257/296 |

FOREIGN PATENT DOCUMENTS

| | | |
|---|---|---|
| 2-170561 | 7/1990 | (JP) . |
| 3-174766 | 7/1991 | (JP) . |
| 6-89941 | 3/1994 | (JP) . |
| 7-30077 | 1/1995 | (JP) . |
| 8-274278 | 10/1996 | (JP) . |

* cited by examiner

Primary Examiner—Long Pham
Assistant Examiner—William David Coleman
(74) Attorney, Agent, or Firm—Young & Thompson

(57) ABSTRACT

A semiconductor memory device comprises a bottom electrode of a capacitor connected to a source region of a semiconductor substrate through a contact plug formed in a portion of a through-hole. The remaining portion of the through-hole has a side-wall film, on which a portion of the bottom electrode film is disposed. The two-level structure of the through-hole improves the step coverage of the side-wall film and avoids over-etching of the silicon substrate.

13 Claims, 5 Drawing Sheets

SEMICONDUCTOR DEVICE HAVING A THROUGH-HOLE OF A TWO-LEVEL STRUCTURE

BACKGROUND OF THE INVENTION (a) Field of the Invention

The present invention relates to a semiconductor device having a through-hole of a two-level structure and, more particularly, to an electrode structure for a stacked capacitor of a memory cell in a semiconductor memory device.

(b) Description of the Related Art

Dynamic random access memory (DRAM) has a stacked capacitor in each memory cell for storing data thereon. FIG. 1 shows the structure of a stacked capacitor in a conventional memory cell, which is fabricated by a known process as described below. First, a field oxide film 102 of an about 400 nm thickness is formed by a LOCOS technology on a p-conductivity type silicon substrate 101 to define an array of cell areas. Subsequently, a gate oxide film (not shown), gate electrode (not shown) and source/drain regions 103 of a MOSFET are formed in each cell area, followed by deposition of a BPSG (borophospho-silicate glass) film 104 as an interlevel dielectric film having a thickness of about 1000 nm and deposition of a $SiO_2$ film 105 having a thickness of about 200 nm. Thereafter, a through-hole 106 of a 0.3 μm×0.3 μm cross-section is formed in the BPSG film 104 and the $SiO_2$ film 105 in each cell region to expose a part of the source/drain region 103. Then, a phosphorous (P)-doped amorphous silicon 107 is deposited on the entire surface including inside the through-hole 106 to a thickness of about 500 nm, followed by patterning thereof to form a capacitor electrode, or bottom electrode of a stacked capacitor.

In the design of the cell structure as described above, the alignment margin between the through-hole 106 and the bottom electrode 107 has been reduced down to as low as 0.05 μm with the development of a higher integration of the DRAM. In FIG. 1, there is shown an ideal case of the alignment wherein no misalignment is present between the through-hole 106 and the bottom electrode 107. However, a critical misalignment is sometimes involved in the DRAM, as shown in FIG. 2A, wherein the misalignment is larger than the design margin L1. In such a case, the bottom electrode 107 exposes the $SiO_2$ film 105 and the BPSG film 104 within the through-hole 106.

Back to FIG. 1, the patterning of the bottom electrode 107 is generally followed by a pre-treatment in which a natural oxide film is removed from the surface of the bottom electrode 107 by using a dilute hydrofluoric acid before the subsequent step of deposition of a nitride film acting as a capacitor film, or insulator film of the capacitor. In this step, the etching rate by the dilute hydrofluoric acid is as low as about 200 angstroms/minute in the $SiO_2$ film as compared to about 600 angstroms/minute in the BPSG film.

In addition, it takes above five minutes to entirely remove the natural oxide film by the etching, and accordingly, as shown in FIG. 2B, the BPSG film 104 is additionally etched by a significant amount in the through-hole 106. Similar problem occurs in the step of formation of a hemispherical grain (HSG) structure for the capacitor electrode. In the process for fabrication of the HSG structure, the etching step for natural oxide film is generally effected on the capacitor electrode by using a dilute hydrofluoric acid, which also involves a situation similar to etching of the BPSG film.

To overcome the above problem, it is proposed that an oxide spacer film be formed on the side wall of the through-hole for protection of the BPSG film, as shown in FIG. 3A. In this proposal, a $SiO_2$ film 108a as low as about 100 nm-thick is formed after the through-hole 106 is formed in a $SiO_2$ film 105 and the BPSG film 104 for exposing the surface of the source/drain region 103. The $SiO_2$ film 108a is then etched-back to be left in the through-hole 106 as a side-wall film 108, followed by deposition of a P-doped amorphous silicon layer to a thickness of about 500 nm and patterning thereof to form a bottom electrode 107 in the through-hole 106, as shown in FIG. 3B. In this technique, the alignment margin L1 between the through-hole 106 and the bottom electrode 107 is increased by an amount corresponding to the thickness (0.1 μm) of the side wall 108, thereby avoiding the etching of the BPSG film 104 even if a significant misalignment occurs between the bottom electrode 107 and the through-hole 106.

In the proposal as mentioned above, however, the side-wall film 108 generally suffers from a poor step coverage problem and variation of the film thickness of the side wall due to the high aspect ratio of the through-hole 106 in a higher integrated circuit. The poor step coverage and the variation of the film thickness necessitates a marginal etching of the side-wall film for exposing the silicon surface, which sometimes involves an over-etching of the silicon surface as illustrated in FIG. 3B to cause a leakage current at the junction in the silicon substrate 101.

Patent Publication JP-A-2(1990)-170561 describes a similar technique wherein two-level interconnection system has a side-wall film in a through-hole which connects upper and lower level interconnect layers together.

Patent Publication JP-A-3-174766 proposes an improvement of the aspect ratio, such as shown in FIG. 4, by providing a two-layer insulation structure, wherein two through-holes for receiving a polysilicon plug 205 and a polysilicon electrodes 208 and formed in $SiO_2$ films 204 and 206, respectively, are communicated to each other to define a substantially single capacitor electrode.

In the described two-layer insulation structure, although the aspect ratio of the through-hole can be improved, the alignment margin between the capacitor electrode and the through-hole cannot be improved. Moreover, it raises costs of the memory device due to the increased fabrication step for photolithography.

SUMMARY OF THE INVENTION

It is an object of the present invention to provide a semiconductor device capable of improving the step coverage of an insulator film in the through-hole to obtain a controlled thickness for a side-wall film in the through-hole, without involving an over-etching of a substrate.

The present invention provides a semiconductor device comprising a semiconductor substrate, a first conductive layer overlying or formed in the semiconductor substrate, a insulator film formed on the first conductive layer and having therein a through-hole for exposing a part of the first conductive layer, a conductive plug disposed in contact with the part of the first conductive layer and filling a first portion of the through-hole, a side-wall film formed on an inner wall of a remaining portion of the through-hole, and a second conductive layer formed on the insulator film and the side-wall film to be connected to the first conductive layer through the conductive plug.

In accordance with the semiconductor device of the present invention, the step coverage of an insulator film for the side-wall film can be improved by providing the conductive plug in the first portion of the through-hole for reducing the effective aspect ratio of the through-hole, without increasing the photolithographic step. The conductive plug also removes occurrence of an over-etching of the semiconductor substrate during the etch-back of the insulator film for forming the side-wall film, in case that the first conductive layer is a diffused region of the semiconductor substrate.

The above and other objects, features and advantages of the present invention will be more apparent from the following description, referring to the accompanying drawings.

DESCRIPTION OF THE PREFERRED EMBODIMENTS

Now, the present invention is more specifically described with reference to accompanying drawings.

Figure 1:
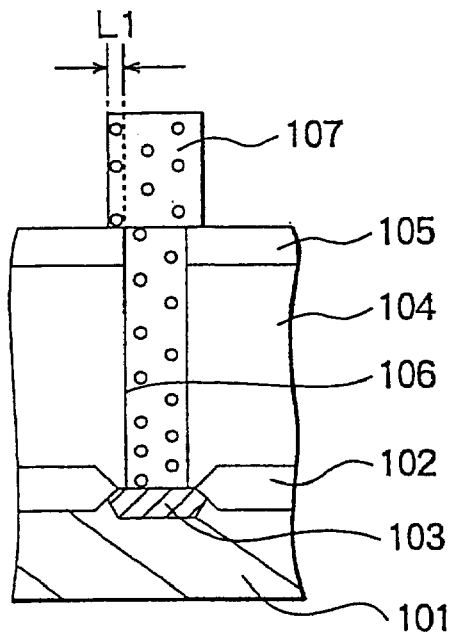
FIG. 1 is a cross-sectional view of a conventional semiconductor device.
Figure 2A:
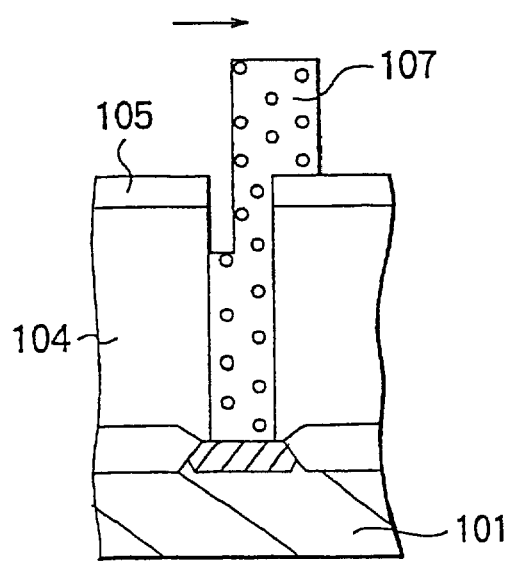
FIG. 2A is a cross-sectional view of another conventional semiconductor device.
Figure 2B:
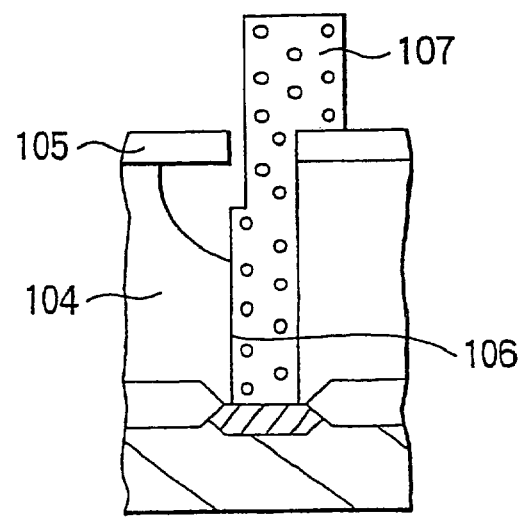
FIG. 2B is a cross-sectional view of the semiconductor device of FIG. 2A, showing a defect in the device.
Figure 3A:
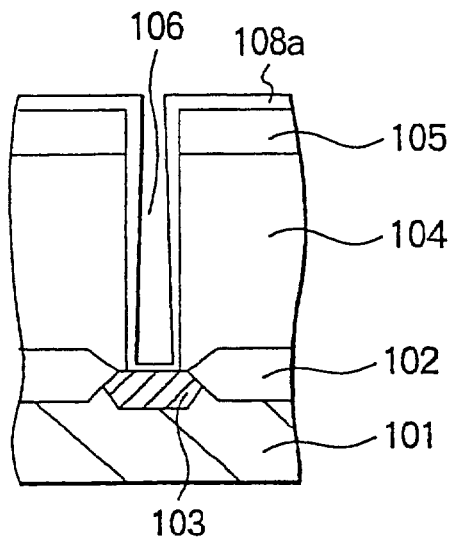
FIGS. 3A and 3B are cross-sectional view of another conventional semiconductor device in consecutive steps of fabrication thereof.
Figure 3B:
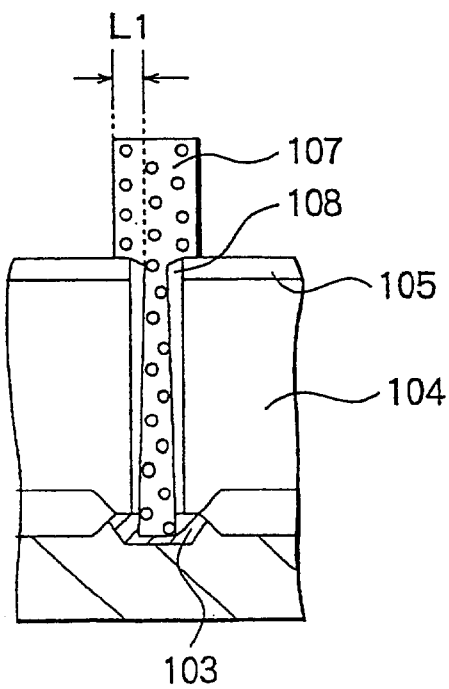
Figure 4:
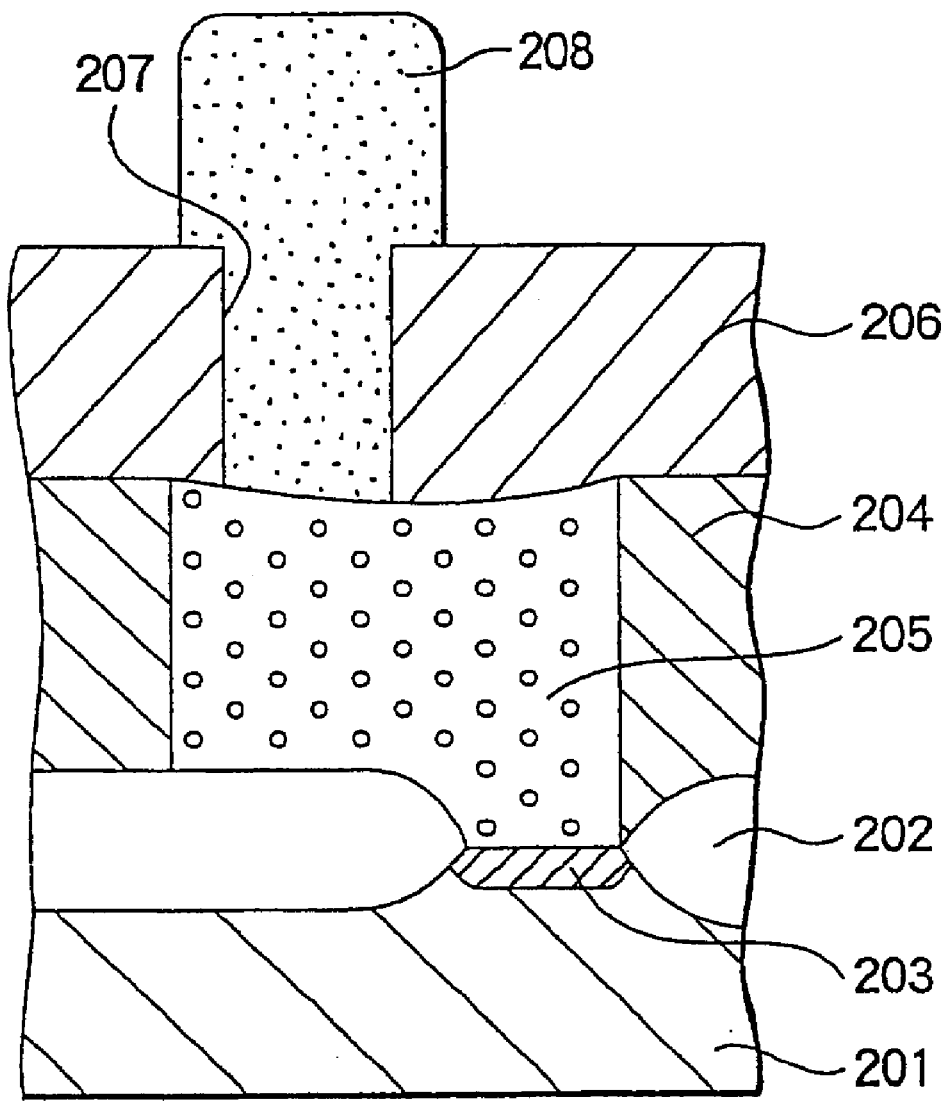
FIG. 4 is a cross-sectional view of another conventional semiconductor device.
Figure 5:
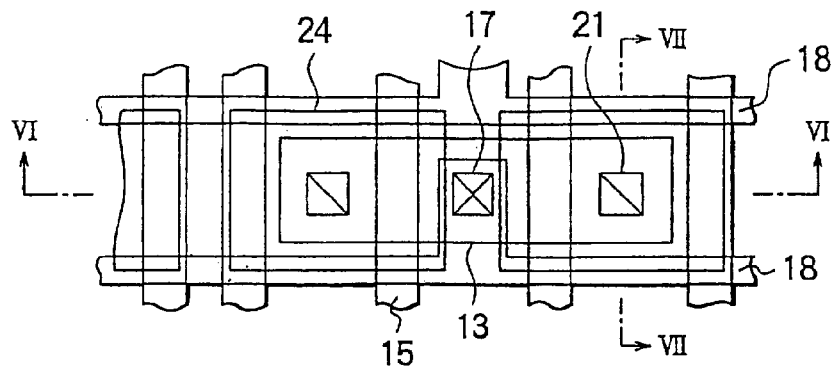
FIG. 5 is a top plan view of a semiconductor device according to an embodiment of the present invention.
Figure 6:
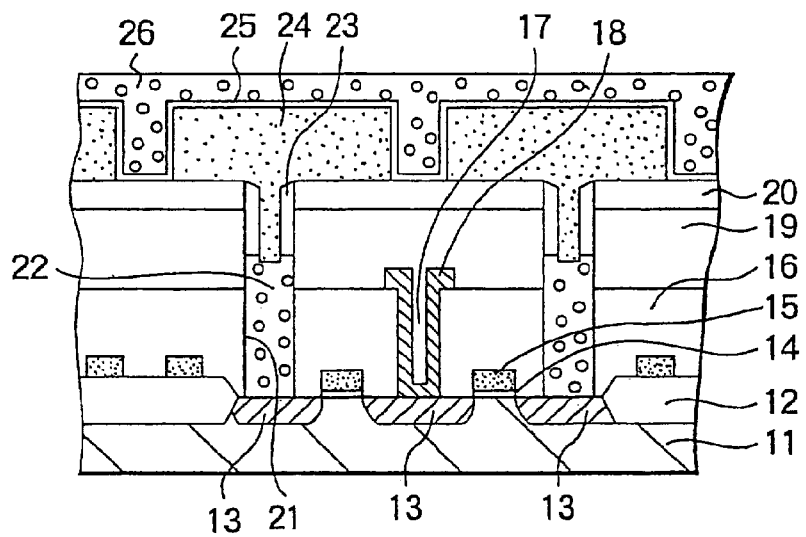
FIG. 6 is a cross-sectional view taken along line VI—VI in FIG. 5.
Figure 7:
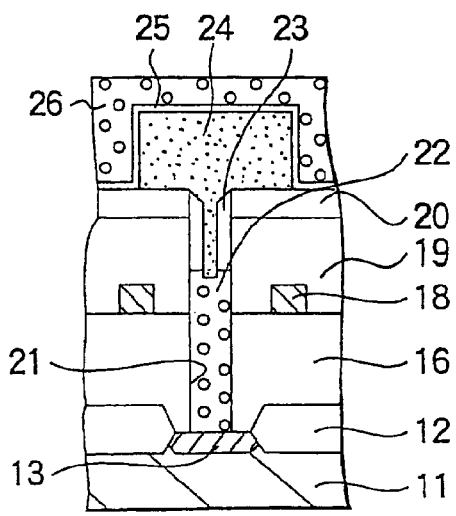
FIG. 7 is a cross-sectional view taken along line VII—VII in FIG. 5.

Referring to FIGS. 5 to 7 showing a semiconductor memory device according to an embodiment of the present invention comprises a p-conductivity type silicon substrate 11, and a field oxide film 12 formed on the surface of the silicon substrate 11 for defining an array of cell areas for memory cells. A MOSFET (cell transistor) is formed in each cell area, which has source/drain regions 13 of n-conductivity type and a gate electrode 15 overlying the silicon substrate 11 with an intervention of a gate oxide film 14 therebetween. A first BPSG film 16 overlies the MOSFET and the field oxide film 12 as an interlevel dielectric film, which has therein a through-hole 17 for exposing the drain region 13 and connecting the drain region 13 to a bit line 18.

A second BPSG film 19 and a $SiO_2$ film 20 are consecutively formed on the first BPSG film 16, and a straight through-hole 21 is formed in the first BPSG film 16, second BPSG film 19 and the SiO2 film 20 for exposing the source region 13. A portion of the through-hole 21 which occupies above a half of the entire through-hole 21 is filled with a contact plug 22 made of P-doped amorphous silicon and disposed in direct contact with the source region 13. The remaining portion of the through-hole 21 has a side-wall insulating film 23 for covering the inner wall of the remaining portion of the through-hole 21, and is filled at the central part thereof with a portion of a capacitor electrode (bottom electrode) 24 made of amorphous silicon and disposed in direct contact with the underlying contact plug 22. The capacitor electrode 24 is opposed to a top electrode (plate electrode) 26 made of P-doped amorphous silicon, with an intervention of a capacitor insulator film 25.

With the configuration of the present embodiment as described above, the $SiO_2$ film for the side-wall insulating film 23 can be deposited with a smaller effective aspect ratio of the through-hole so that the step coverage of the $SiO_2$ film can be improved. In addition, since the contact plug 22 underlies the side-wall insulating film 23, etch-back of the $SiO_2$ film for leaving the side-wall insulating film 23 in the through-hole 21 does not over-etch the silicon substrate 11, and accordingly, does not degrade the resultant cell transistor.

Figure 8A:
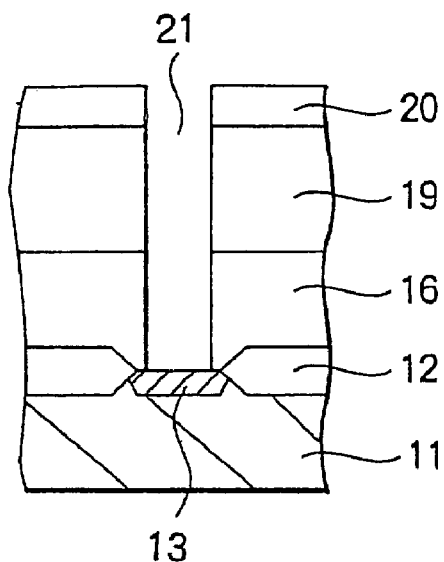
FIGS. 8A to 8D are cross-sectional views in consecutive steps of fabrication of the semiconductor device of FIG. 5.

Referring to FIGS. 8A to 8D, there is shown a fabrication process for a semiconductor device such as shown in FIG. 5. FIGS. 8A to 8D correspond to the cross-section shown by FIG. 7. First, as shown in FIG. 8A, a 400 nm-thick field oxide film 12 is formed by a LOCOS technology on a p-conductivity type silicon substrate 11 for defining a plurality of cell areas. Then, a gate oxide film, gate electrode (both not shown in FIG. 8A) and source/drain regions 13 are consecutively formed in each of the cell areas to form a MOSFET. After deposition of a 500 nm-thick first BPSG film 16 on the entire surface, a first through-hole (not shown) for a bit line is formed therein, followed by formation of the bit line.

Subsequently, a 500 nm-thick second BPSG film 19 and a 200 nm-thick $SiO_2$ film 20 are consecutively deposited, followed by formation of a second through-hole 21 of a 0.3 $\mu$m×0.3 $\mu$m cross-section for exposing the surface of the source region 13.

Figure 8C:
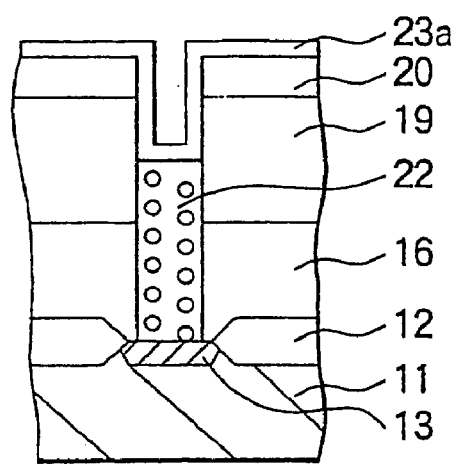
Figure 8B:
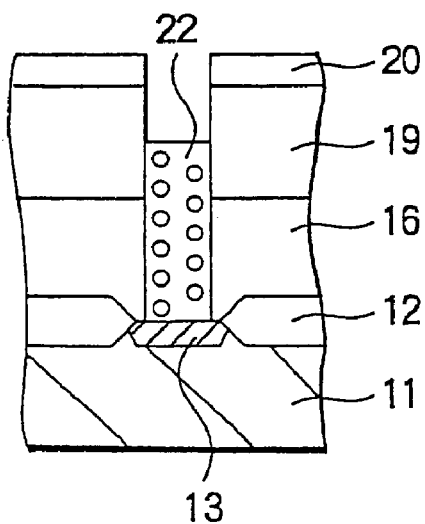
Figure 8D:
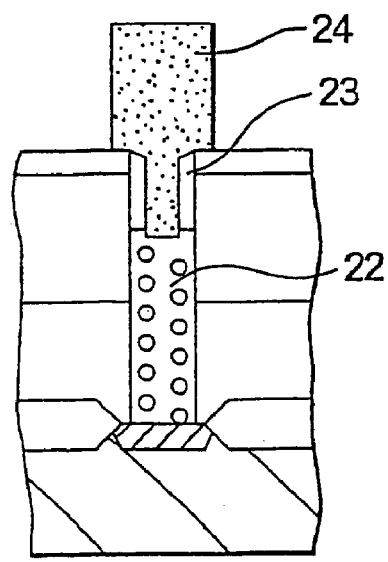

Thereafter, as shown in FIG. 8B, a P-doped amorphous silicon is deposited on the entire surface to a thickness of 300 nm, followed by etch-back thereof to leave a contact plug 22 which fills the through-hole 21 for above a half of the entire depth of the through-hole 21. It is preferable that the contact plug 22 have a depth of about 800 nm in this example. A polysilicon film or a tungsten film with a barrier metal may be used instead of the amorphous silicon film. Further, the deposition step may be replaced by a selective growth step for selectively growing the contact plug 22 directly in the through-hole 21.

Subsequently, as shown in FIG. 8C, a 100 nm-thick $SiO_2$ film 23a is deposited, followed by etch-back thereof by using a reactive ion etching (RIE) to leave the $SiO_2$ film at the inner wall of the remaining portion of the through-hole 21 as a side-wall insulating film 23. The side-wall insulating film 23 may be made of silicon nitride instead. Thereafter, a second P-doped amorphous silicon is deposited to a thickness of 500 nm, followed by patterning thereof to form a capacitor electrode 24. Further, a capacitor insulator film and a plate electrode are formed thereon to form a cell capacitor.

In the above embodiment, since the contact plug 22 made of amorphous silicon fills the 1200 nm-deep through-hole to a thickness of 800 nm, the effective aspect ratio of the through-hole during the side-wall film forming step is reduced from 4 to 1.3. This improves the step coverage of the $SiO_2$ film and reduces the variation of the thickness of the side-wall insulating film 23. As a comparison between the present embodiment and the conventional device, the variation of the side-wall insulating film can be reduced from about 30% for the conventional device to about 10% in the present embodiment. In addition, the 30% variation in the conventional device provided an over-etching of the silicon substrate by about 50 nm, whereas the present embodiment provided no over-etching of the silicon substrate due to the contact plug 22.

In the above embodiment, although a source region is used as a first conductive layer and a capacitor electrode is used as a second conductive layer, the first and the second conductive layers may be of other doped silicon types, for example doped amorphous silicon or polycrystalline silicon, or the first and second conductive layers may be any metallic layers instead.

Since the above embodiments are described only for examples, the present invention is not limited to the above embodiments and various modifications or alterations can be easily made therefrom by those skilled in the art without departing from the scope of the present invention.

What is claimed is:

1. A semiconductor device comprising a semiconductor substrate, a first conductive region that is a diffusion region in said semiconductor substrate, an insulator film that includes a plurality of layers overlapping and in direct contact with a part of said first conductive region and having therein a through-hole for exposing a further part of said first conductive region, a conductive contact plug disposed in contact with said further part of said first conductive region and filling a first portion of said through-hole, a sidewall insulating film formed on an inner wall of a remaining portion of said through-hole in said insulator film, and a second conductive region formed on said insulator film and said sidewall film connected to said first conductive region through said conductive contact plug, said second conductive region being a bottom electrode of a capacitor.

2. A semiconductor device as defined in claim 1, wherein said first conductive region is a doped silicon layer.

3. A semiconductor device as defined in claim 2, wherein said doped silicon layer is made of amorphous silicon.

4. A semiconductor device as defined in claim 2, wherein said doped silicon layer is made of polycrystalline silicon.

5. A semiconductor device as defined in claim 1, wherein said first portion of said through-hole is larger in height than said remaining portion.

6. a semiconductor device as defined in claim 1, wherein said through-hole is substantially straight.

7. A semiconductor memory device comprising:

a substrate having a top surface;

a first conductive region formed on or in said substrate and having a top surface coincident with said top surface of said substrate;

at least one insulator film overlapping a portion of said first conductive region and having therein a through-hole for exposing a part of said top surface of said first conductive region, wherein said at least one insulator film has a top surface;

a conductive contact plug disposed in contact with said part of said top surface of said first conductive region and filling a first portion of said through-hole in said at least one insulator film, said conductive contact plug being in direct contact with said at least one insulator film;

a sidewall insulating film formed on an inner wall of a remaining portion of said through-hole in said at least one insulator film;

a second conductive plug formed on said top surface of said at least one insulator film and on said sidewall insulating film and filling said remaining portion of said through-hole in said at least one insulator film, wherein said second conductive plug is a bottom electrode of a capacitor, and wherein said bottom electrode is electrically connected to said conductive contact plug through said conductive plug; and a top electrode opposed to said bottom electrode, wherein said bottom electrode and said top electrode are separated by a capacitor insulator film.

8. The semiconductor memory device of claim 7, wherein said first conductive region is a diffusion region of a MOSFET device.

9. The semiconductor memory device of claim 7, wherein said first conductive region is one of amorphous silicon and polycrystalline silicon.

10. The semiconductor memory device of claim 7, wherein said conductive plug and said top electrode are doped amorphous silicon.

11. The semiconductor memory device of claim 7, wherein said bottom electrode is amorphous silicon.

12. The semiconductor memory device of claim 7, wherein said conductive contact plug occupies greater than one-half the extent of said through-hole.

13. The semiconductor memory device of claim 7, wherein said sidewall insulating film is one of silicon oxide and silicon nitride.

* * * * *